United States Patent [19]
Kohama

[11] Patent Number: 5,731,607
[45] Date of Patent: Mar. 24, 1998

[54] SEMICONDUCTOR INTEGRATED CIRCUIT DEVICE

[75] Inventor: Kazumasa Kohama, Kanagawa, Japan

[73] Assignee: Sony Corporation, Japan

[21] Appl. No.: 633,431

[22] Filed: Apr. 17, 1996

[30] Foreign Application Priority Data

Apr. 24, 1995 [JP] Japan ............................ 7-123112

[51] Int. Cl.$^6$ ..................... H01L 27/02; H03K 3/26
[52] U.S. Cl. ................... 257/275; 257/364; 327/379
[58] Field of Search ......................... 327/379, 384, 327/387; 257/275, 364

[56] References Cited
U.S. PATENT DOCUMENTS 5,023,688  6/1991  Ando et al. .................... 327/379
5,266,843  11/1993  Walker et al. ................ 307/296.2

FOREIGN PATENT DOCUMENTS 2-161769  6/1990  Japan ........................ 327/379

*Primary Examiner*—Donald Monin
*Attorney, Agent, or Firm*—Ronald P. Kananen

[57] ABSTRACT

In a semiconductor integrated circuit device, particularly in a switch circuit, a first and a second FETs are connected in series with respect to the signal path, and a third FET is connected between the node of these first and second FETs and the ground region. Thereby, low insertion loss, high isolation, and miniaturization of the entire circuit can be realized simultaneously.

14 Claims, 12 Drawing Sheets

| TYPE OF SPDT SWITCH | CASES HAVING NONE OF PARASITIC INDUCTANCE | CASES WHERE GROUNDS ON SEMICONDUCTOR SUBSTRATE ARE COMMON | | | CASES WHERE GROUNDS ON SEMICONDUCTOR SUBSTRATE ARE INDEPENDENT | |
|---|---|---|---|---|---|---|
| | | PARASITIC INDUCTANCE L 0.1nH | PARASITIC INDUCTANCE L 0.25nH | PARASITIC INDUCTANCE L 0.5nH | PARASITIC INDUCTANCE L 0.5nH | PARASITIC INDUCTANCE L 1nH |
| SPDT-SW OF FIG. 1 | 48.6dB | 45.3dB | 39.6dB | 34.0dB | 42.0dB | 36.8dB |
| SPDT-SW OF FIG. 2 | 93.2dB | 55.4dB | 47.3dB | 41.0dB | 79.3dB | 68.0dB |
| SPDT-SW OF FIG. 8 | 61.0dB | 59.1dB | 54.5dB | 49.1dB | 54.2dB | 48.7dB |

FIG. 10

SEMICONDUCTOR INTEGRATED CIRCUIT DEVICE

BACKGROUND OF THE INVENTION

1. Field of the Invention

The present invention relates to a semiconductor integrated circuit device, and more particularly to an improvement of that which contains a switch circuit which is required coexistence of low insertion loss and high isolation.

2. Description of the Related Art

At present, development of mobile communication business (for instance, a mobile phone and a portable telephone) is remarkable. However, as communication business has been developed, insufficiency of communication line has been aggravated in cities, and examinations have been started of putting various mobile communication systems to practical use, in various countries. In many of these communication systems, adopting of digital communication system is being advanced, and, as to a communication band, adopting of quasi-microwave band which is the higher frequency band than that of the present system is being advanced.

In communication terminals of these communication system, in many cases, semiconductor field effect transistors (FETs) are used in their signal processing portions. Especially, in the case of a portable terminal in which portability is regarded as important, it is becoming important to develop a monolithic microwave IC (hereinafter, referred to as an MMIC) which is utilizing GaAs FET, as an IC which is able to realize miniaturization, low-voltage driving and low consumption power.

In particular, a high frequency switch for switching high frequency signals in a portable terminal is becoming to one of key devices.

In the case where an FET is utilized as a switch, switching of the working condition depends on switching of the bias voltage which is applied to the gate electrode. For instance, if a bias voltage which is sufficiently higher than the pinch-off voltage of the FET is applied to the gate electrode, impedance between the drain and the source is lowered, and the FET can be led to ON state. On the other hand, if a bias voltage which is sufficiently lower than the pinch-off voltage of the FET is applied to the gate electrode, impedance between the drain and the source is raised, and the FET can be led to OFF state. Thus, impedance between the drain and the source of an FET is largely varied depending on the working condition of the FET.

In the case of a GaAs FET which is on the market presently, it can be considered to be a resistance component in an equivalent circuit of its ON state, and can be approximated to be a capacitance component in an equivalent circuit of its OFF state. In this connection, values of resistance and capacitance of an FET are on the orders of several [Ωmm] and several hundreds [fF/mm], respectively, for each unit gate-width Wg of the FET. For instance, ON-resistance Ron comes to 2 [Ωmm], and capacitance Coff comes to 300 [fF/mm].

On the assumption that a gate width Wg of an FET is about 1 [mm], loss in ON state with respect to 2 [GHz] of signal band becomes about 0.2 [dB], and low insertion loss can be thus realized.

On the other hand, isolation between a drain and a source in OFF state becomes 10 [dB] or less, hence, coexistence of low insertion loss and high isolation is hard.

Therefore, on a frequency which is higher than or equal to quasi-microwave band, a switch circuit is used which is comprised of combination of FETs which have been placed in series with respect to the signal path and FETs which have been placed in shunt location, thereby aiming coexistence of low insertion loss and high isolation.

This is depending on that an RF signal which has leaked out via the series FET in OFF state, which is the capacitance Coff equivalently, can be led into the ground through the shunt FET of ON state. Improvement of the isolation is hereby realized.

In this connection, to realize high isolation using only series FETs, gate widths of the FETs may be reduced, however, if it is done like this, ON resistance Ron of the FETs increases, and aggravation of insertion loss cannot be therefore avoidable. On the other hand, if only shunt FETs are used, there is a problem that the isolation in low frequency region become insufficient.

As a general example of a switch circuit which is combined a series FET and a shunt FET, there is that which is shown in FIG. 1. The figure shows a single pole dual throw (SPDT) switch circuit. As is known from the figure, the SPDT switch circuit is formed by the combination of one FET which has been connected in series with respect to the signal path and one FET which has been connected into a shunt.

When a switch circuit is thus composed, insertion loss with respect to a signal of 1.9 [GHz] band can be led to 1 [dB] or less, at the same time, isolation can be led to 23–31 [dB]. This isolation characteristics is a sufficient property, for uses in such as switching of an antenna of a portable terminal. However, in the case where it is utilized for the following uses, insufficient.

For instance, the PHS system, which is a codeless telephone system, corresponds to this use. The PHS system is a time division multiple access (TDMA) mode, that is, a mode wherein the same frequency is used for transmission and reception. Therefore, in a mixer which is used for frequency conversion between the RF signal and the IF signal, the local oscillation (LO) signals which have the same frequency are needed for the uses of transmission and reception, respectively.

In this case, two synthesizers for the LO signals may be provided for transmission and reception, respectively; however, the packaging area becomes large, and an increase in cost will be brought.

A thing like this is not desirable for a portable terminal of which cost reduction and miniaturization are indispensably required.

So, in many cases, such a system is used that one synthesizer is shared between transmission and reception.

At this time, in some cases, isolation of 80 [dB] or more with respect to the signal of 1.66 [GHz] is required of a switch which is used in this portion of, for instance, a PHS system. Thus, in a communication terminal, a switch is required which needs very large isolation in the quasi-microwave band. Thus, miniaturization, cost reduction, lowering of the voltage, and lowering of the electric power become the indispensable conditions for a communication terminal; therefore, it is desired to develop a switch based on GaAs MMIC which can ensure large isolation in the quasi-microwave band.

In order to realize a high-isolation switch stated above, it is considered to connect, for instance, a basic T type switch circuit which is formed by a combination of a series FET and a shunt FET with respect to the signal line by three stages.

In the case of thus composed switch circuit, 60 [dB] of isolation is attained with respect to a signal of 1.9 [GHz] band.

However, this MMIC is an SPST switch, therefore, in the case where it is utilized for switching of LO signal, etc., two switch circuits of this constitution are required. Moreover, 0.6 [mm]×0.9 [mm] of chip area is required for each chip, it is comparatively large for an SPST switch. Therefore, problems are yet left, in the point of miniaturization and cost reduction. Insertion loss is 1.6 [dB], it is comparatively large.

In this connection, in the point of realization of cost reduction, an SPDT switch MMIC is considered which is utilizing a small-sized resin package. This intends to improve the isolation characteristics of a switch IC, by providing a ground electrode between the signal electrodes. However, the isolation which is attained by this plan is 28.66 [dB] in L band, and it is hard to say that a sufficient isolation has been ensured.

As stated above, a switch is not in existence which realizes miniaturization and cost reduction and also shows great isolation in the quasi-microwave band, and so realization with the present technique is hard.

SUMMARY OF THE INVENTION

In view of the foregoing, an object of the present invention is to provide a semiconductor integrated circuit device containing a switch circuit which is able to realize low insertion loss and high isolation, and also able to realize miniaturization and cost reduction.

The foregoing object and other objects of the present invention have been achieved by the provision of a switch circuit constructed in such a manner that a first and a second FETs are connected in series with respect to the signal path, and a third FET is connected between the node of the first and the second FETs and the ground region.

When the first and the second FETs have been turned on together and the third FET has been turned off, the signal path is turned on.

On the other hand, when the first and the second FETs have been turned off together and the third FET has been turned on, the signal path is turned off.

The nature, principle and utility of the invention will become more apparent from the following detailed description when read in conjunction with the accompanying drawings in which like parts are designated by like reference numerals or characters.

BRIEF DESCRIPTION OF THE DRAWINGS

In the accompanying drawings:

FIG. 10 is a schematic diagram illustrating results of isolation characteristics of respective SPDT switch circuits;

DETAILED DESCRIPTION OF THE EMBODIMENT

Preferred embodiments of the present invention will be described with reference to the accompanying drawings:

(1) SPST Switch Circuit (1—1) T type SPST Switch Circuit

Figure 5:
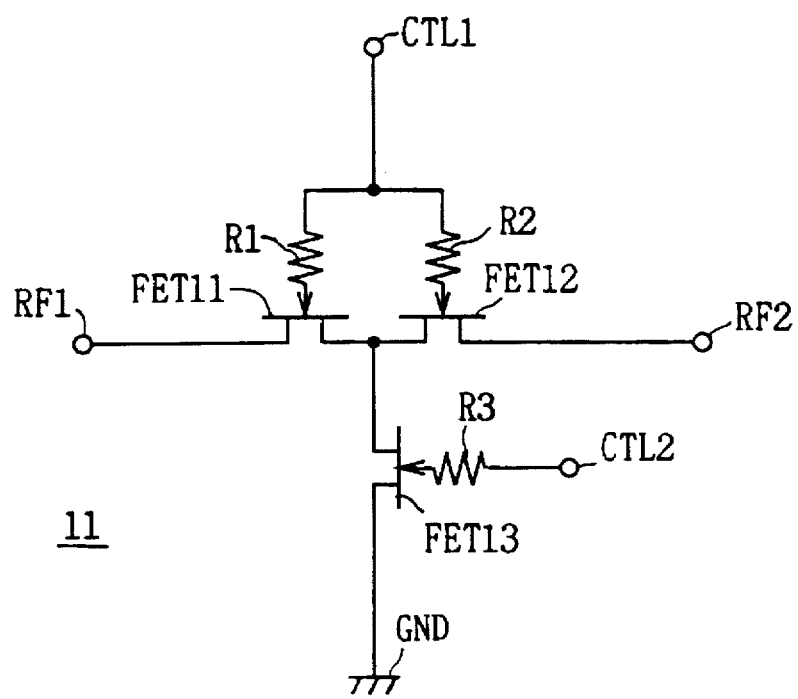
FIGS. 5 to 8 are connection diagrams illustrating an example of a semiconductor integrated circuit which includes the SPST switch circuit according to the present invention.

Basic construction of an SPST switch circuit is shown in FIG. 5. This switch circuit 11 is characterized by T type configuration, wherein two FETs FET11 and FET12 are connected in series with respect to the signal path (a signal input terminal RF1—a signal output terminal RF2), and FET13 is connected to shunt from the node of these two FETs FET11 and FET12. FET11 and FET12, which are connected in series with respect to the signal path, are controlled into on state or off state at the same time, by the control voltage which is applied to the control terminal CTL1.

On the other hand, FET13, which has been connected to form a shunt with respect to the signal path, is controlled to become on state or off state, complimentarily with FET11 and FET12, by the control voltage which is applied to the control terminal CTL2.

According to the above construction, since two FETs FET11 and FET12 are connected in series with respect to the signal path, the switch circuit 11 is able to diminish its combined capacitance Coff and able to improve its isolation, compared with the case where one FET is connected in relation to the signal path. The number of elements increases only one compared to the conventional circuit (FIG. 1), and so the chip area may be small. Accordingly, it is able to realize a small-sized and low-priced switch circuit which reconciles low insertion loss and high isolation.

(1-2) T type SPST Switch Circuit having Bias Resistors

Figure 6:
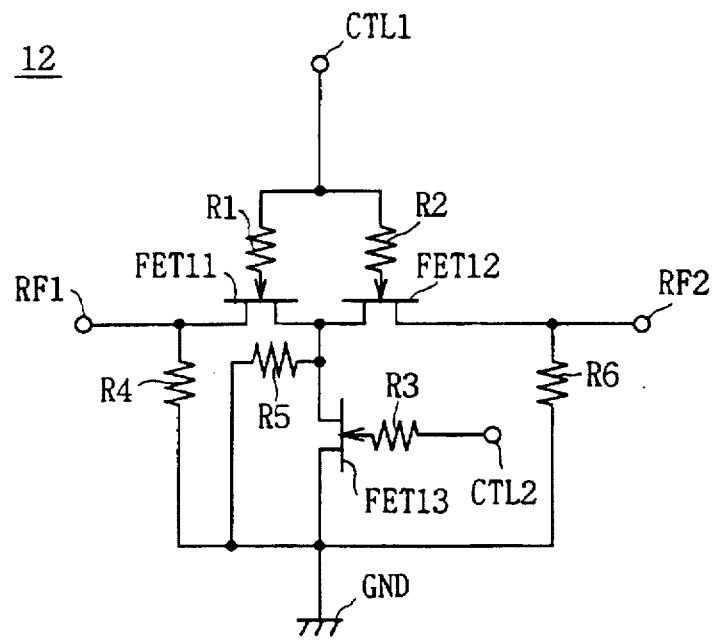

An example of the application circuit of the SPST switch circuit is shown in FIG. 6, which has the same reference numbers as FIG. 5 on the corresponding parts. The feature of the switch circuit 12 is that bias resistors R4, R5 and R6 have been connected between the drain terminals and the source terminals of two FETs FET11 and FET12 which are connected in series with respect to the signal path and the ground GND.

In the case of the switch circuit 12, because the drain region and the source region of each FET which is contained in the circuit can be biased with direct current (DC) to the same electric potential as the ground GND, these drain region and source region need not to be biased from outside, and the package area can be diminished. In this connection, if it is planned to bias these regions by any external circuit without using these resistors, the signal input terminal RF1 and the signal output terminal RF2 must be biased by means of resistors or inductors, and, additionally, capacitance for power-source bypassing must be connected between those and the ground in order to suppress undesired signals, and so the package area becomes large inevitably.

Moreover, in the case of the switch circuit 12, the resistors R4, R5, and R6 are directly connected to the ground GND, and so it is able to let the signal which has leaked from these resistors go to the ground GND immediately, and degrading of isolation in the IC via these resistors can be avoided. In this connection, if it is planned to bias these regions by any external circuit without using these resistors, there are a problem in size, which is related to wavelength of a signal, and an anxiety of aggravation of the characteristics (especially, aggravation of the isolation) which is due to irregularity of mounting of the parts of the external bias circuit. Moreover, in the case where an external circuit is used, there are fears of increase in cost and increase in mounting area, etc.

According to the above construction, because two FETs FET11 and FET12 are connected in series with respect to the signal path, the switch circuit 12 is able to diminish the combined capacitance Coff and able to improve the isolation. Furthermore, small number of elements are needed, and the chip area can be diminished.

In addition, it is able to dispense with an external bias circuit and able to realize a switch circuit which is excellent in package area, for the reason that the drain regions and the source regions of two FETs FET11 and FET12, which have been connected in series with respect to the signal path, have been biased to the same electric potential as the ground GND by means of the internal resistors R4 to R6.

Accordingly, it is able to realize a small-sized and low-priced switch circuit which reconciles low insertion loss and high isolation.

(1-3) T type SPST Switch Circuit having DC Stopping Capacitor

Figure 7:
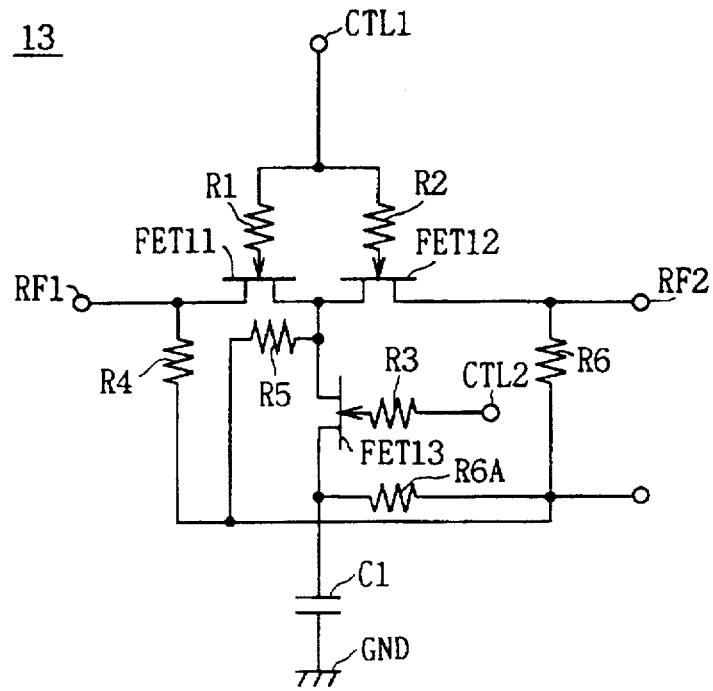

An example of the application circuit of the SPST switch circuit is shown in FIG. 7, which has the same reference numbers as FIG. 6 on the corresponding parts. The feature of the switch circuit 13 is that a capacitance Cl has been connected between the FET13, which has been connected to shunt with respect to the signal path, and the ground GND, and so the FET13 has been disconnected from the ground GND with respect to direct current.

In the case of the switch circuit 13, it is able to apply an arbitrary bias voltage which is according to the voltage Vdd1 to the drain region and the source region of each FET, because the drain regions and the source regions of FET11 to FET13 are disconnected from the 9round GND by means of the capacitance C1. This means that these regions can be biased into positive.

At this time, if the value of the voltage Vdd1 is set to an appropriate positive value, it is able to generate a negative voltage as the relative electric potential, toward the drain and the source, of the 9ate of each FET, even though the case where only positive voltages are used as the control voltages which are applied to the control terminals CTL1 and CTL2. Accordingly, it is able to realize switching operation which is based on only positive power source.

Moreover, in the case of the switch circuit 13, it is not required to cut the 9round GND with respect to direct current at outside of the IC, therefore, it is able to save the mounting area and to prevent degradation of characteristics which is due to mounting of the DC stopping capacitor.

Furthermore, in the case of the switch circuit 13, degradation of the isolation through these resistors scarcely occurs, because a signal which leaks through the bias resistors R4, R5, R6, and R6A can be streamed to the ground GND via the capacitance C1.

Therefore, it is able to obtain a small-sized and low-priced switch circuit which can be driven by a positive power source and which can reconcile low insertion loss and high isolation.

(2) SPDT Switch Circuit

Next, a description is given of an SPDT switch circuit which is one of switch circuits which are formed by combination of the abovementioned SPST switch circuits. In accordance with a way to give bias voltages and a way to disconnect direct current toward the ground GND, several examples of connections will be explained hereinafter.

(2-1) SPDT Switch Circuit having DC Stopping Capacitor

Figure 8:
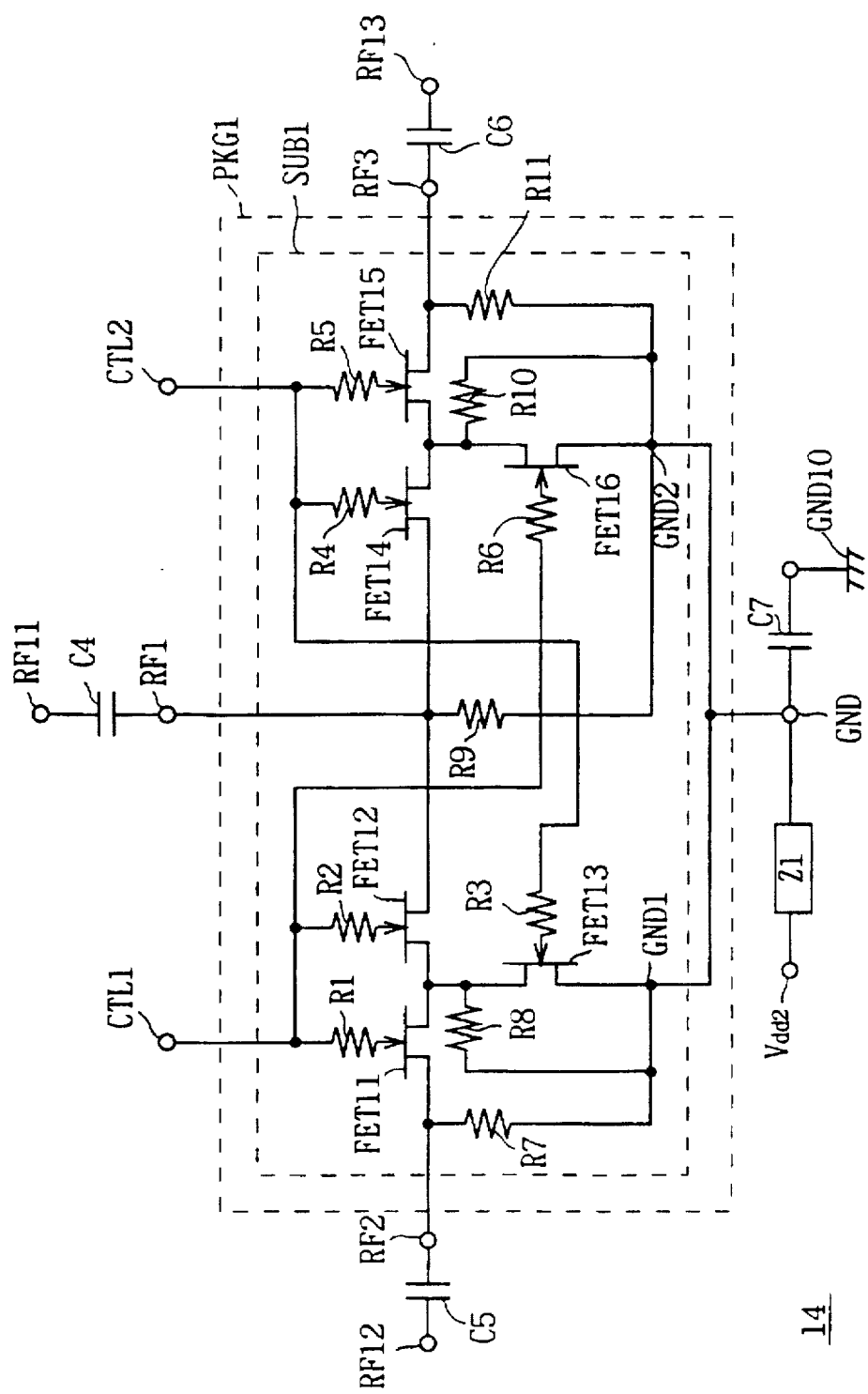

Basic construction of an SPDT switch circuit is shown in FIG. 8. The switch circuit 14 is composed in such a manner that the SPST switch circuit having construction shown in FIG. 6 is connected to each of a first signal path (a signal terminal RF11—a signal terminal RF12) and a second signal path (a signal terminal RF11—a signal terminal RF13).

With respect to the first signal path, those which are connected in series are two FETs FET11 and FET12, and that which is connected into a shunt is FET13.

With respect to the second signal path, those which are connected in series are two FETs FET14 and FET15, and that which is connected into a shunt is FET16.

Moreover, bias resistors R7, R8, R9, R10, and R11 are connected between the ground GND, and the drain terminals and the source terminals of FET11, FET12, FET14, and FET15 which are connected in series with respect to the signal path.

Therefore, the drain region and the source region of each FET which is contained in the switch circuit can be biased with respect to direct current, to become to the same electric potential as GND1 or GND2.

For instance, if 0 [V] is applied as the electric potentials of GND1 and GND2, and voltages of 1 [V] and −3 [V] are applied to the control terminals CTL1 and CTL2 respectively, then next electric potentials are applied to respective FETs.

At first, about 1 [V] is applied to the gates of FET11, FET12 and FET16, with respect to the drain or the source of respective FETs.

On the other hand, voltage of about −3 [V] is applied to the gates of FET13, FET14 and FET15.

On the assumption that pinch-off voltage Vp of an FET which is used in the IC is −1 [V], the FET turns on when bias voltage of 1 [V] has been applied to the gate. And, When bias voltage of −3 [V] has been applied to the gate, the FET turns off.

In other words, when 1 [V] has been applied to the control terminal CTL1 and −3 [V] has been applied to the control terminal CTL2, FET11, FET12 and FET16 turn on and FET13, FET14 and FET15 turn off.

Therefore, the first signal path (RF11–RF12) turns on. On the other hand, FETs which have been connected in series with respect to the second signal path (RF11–RF13) turn off, and an FET which has been connected into a shunt turns on. Accordingly, the second signal path turns off.

On the contrary, when biases of −3 [V] and 1 [V] have been applied to the control terminals CTL1 and CTL2 respectively, the first signal path (the way from RF11 to RF12) turn off, and the second signal path (the way from RF11 to RF13) turn on.

By applying 1 [V] or −3 [V] to the control terminals CTL1 and the CTL2 in this manner, switching between the first signal path (RF11–RF12) and the second signal path (RF11–RF13) is enabled.

The drain regions and the source regions of respective FETs in the switch circuit are biased with respect to direct current into the same electric potential as GND1 or GND2 through the resistors R7, R8, R9, R10, and R11, therefore, a need of biasing these drain regions and source regions from outside can be eliminated.

In this connection, in the case where these regions are biased by means of an external circuit, it is required to bias the signal terminals RF1, RF2, and RF3 through resistors or inductors, and to place capacitance for power-source bypassing between those and the ground in order to suppress undesired signals, in general.

In the case of the switch circuit 14, because the resistors R7, R8, R9, R10, and R11 are directly connected to the ground GND, signals which have leaked through these resistors are let go to the ground GND directly, therefore aggravation of the isolation within the IC via these resistors not occurs.

If external biasing have been performed without these resistors, a problem in size against the signal wavelength, and an anxiety of aggravation of the characteristics (especially, aggravation of the isolation) which is due to irregularity of mounting of the parts of the external bias circuit. Moreover, there are fears of increase in cost and increase in mounting area, etc. which are owing to the external bias circuit, and so it is not preferable as a portable terminal, etc.

On the above construction, operating characteristics of the switch circuit 14 is explained.

Figure 1:
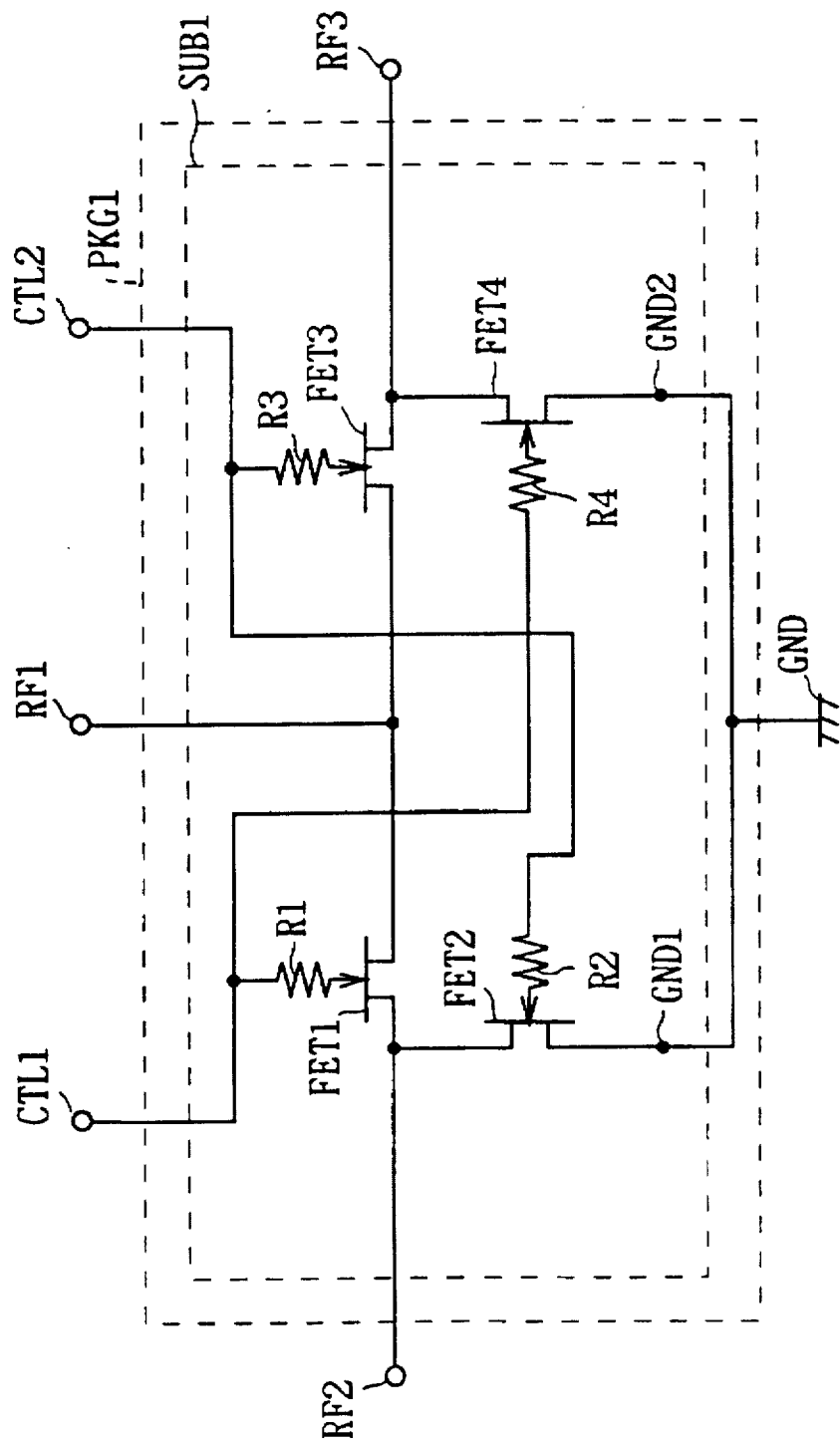
FIG. 1 is a connection diagram illustrating a conventional switch circuit.
Figure 3:
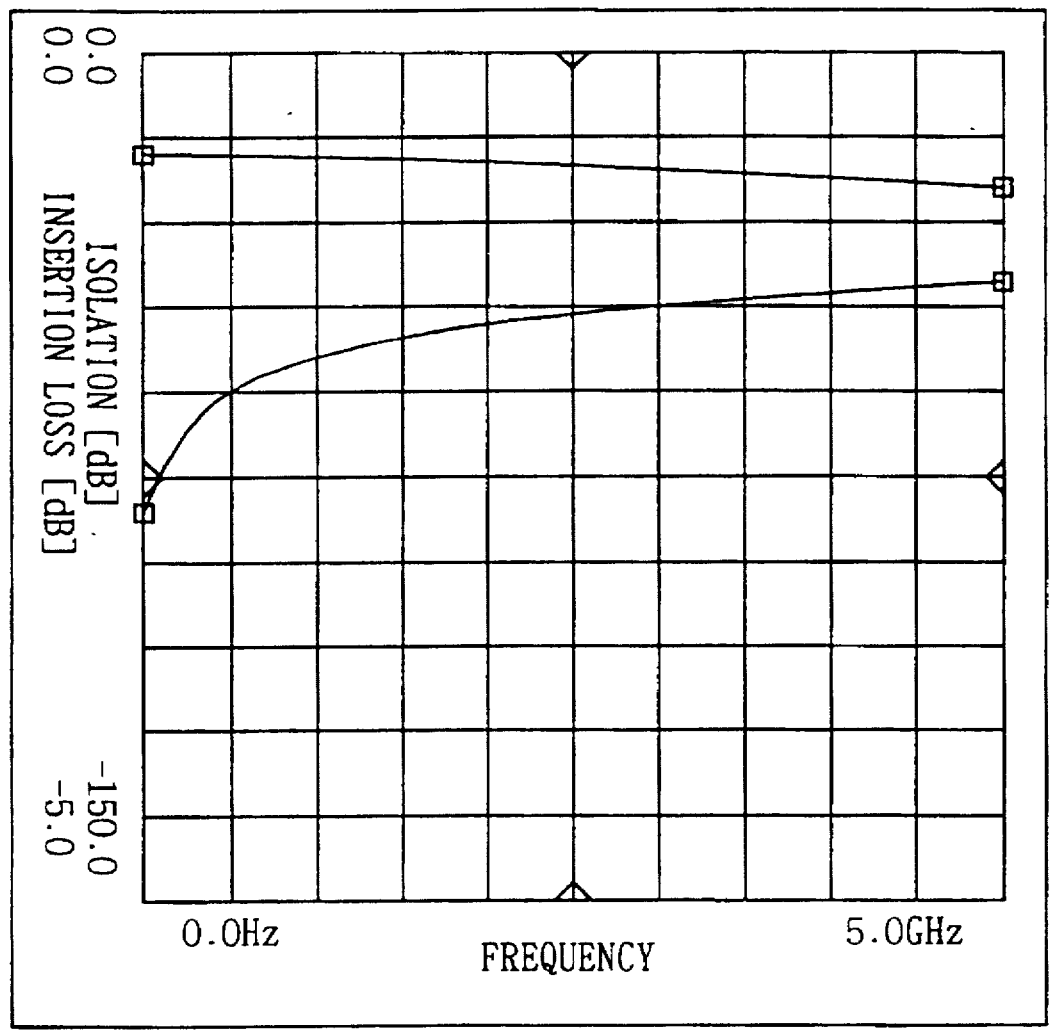
FIG. 3 is a characteristic curvilinear diagram illustrating insertion loss and isolation characteristics of an SPDT switch circuit according to the conventional circuit.
Figure 9:
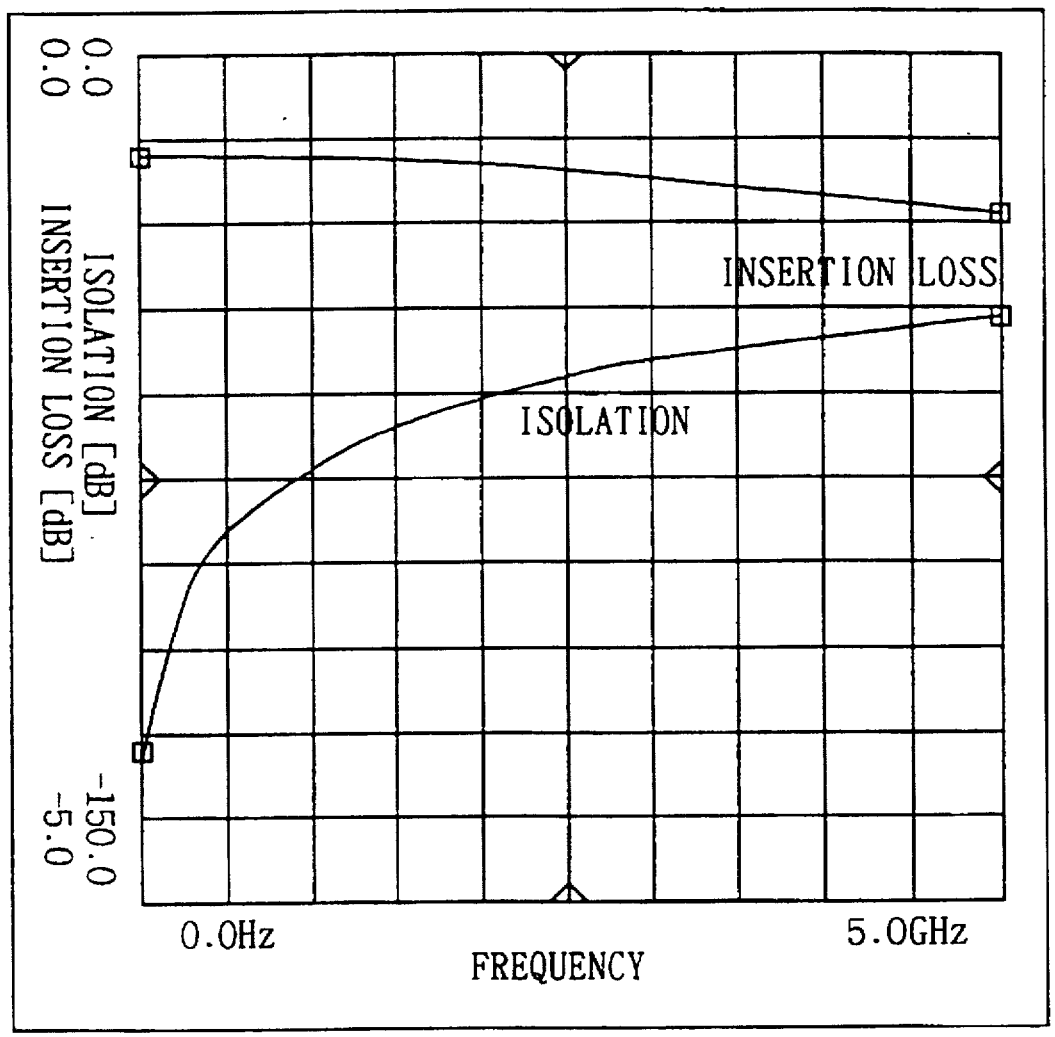
FIG. 9 is a characteristic curve illustrating insertion loss and isolation characteristics of a SPDT switch circuit according to the present invention.

As shown in FIG. 8, the switch circuit 14 is, basically, that which has T type construction wherein two series FETs and one shunt FET, with respect to the signal path, have been connected, and the isolation of which have been improved thereby. Frequency dependency of insertion-loss and isolation of the switch circuit 14 are shown in FIG. 9. On the other hand, frequency dependency of insertion-loss and isolation of the conventional circuit which has been shown in FIG. 1 are shown in FIG. 3.

An FET which has been used in this simulation is a GaAs 3unction-type FET having gate length of 0.5 [μm], and it is assumed that ON resistance Ron of which is 2 [Ω], OFF capacitance Coff is 300 [fF]. Moreover, it is assumed that the control terminals CTL1 and CTL2 have been controlled with 1/-2 [V]. In order to bring insertion losses of the switch circuit 14 of FIG. 8 and the switch circuit 1 of FIG. 1 to the same level, it is assumed that gate width of series FETs of FIG. 8 is 600 [μm] and gate width of series FETs of FIG. 1 is 300 [μm]. These are the values which have been determined based on the condition for making ON resistance of FETs which are connected in series with respect to the signal path same.

At this time, while the insertion loss of the switch circuit 114 of the embodiment is about 0.65 [dB] on, for instance, 2 [GHz], the insertion loss of the conventional circuit 1 is about 0.61 [dB] on 2 [GHz], thus they are nearly the same. On the other hand, while the isolation of the switch circuit 14 of the embodiment is about 61.0 [dB] on 2 [GHz], the isolation of the conventional circuit 1 is 48.6 [dB], and so it is known that the switch circuit 14 of the embodiment is greater by about 12 [dB]. Moreover, it is known that the isolation of the switch circuit 14 of the embodiment is exceeding, with a larger difference, on the quasi-microwave band.

Figure 2:
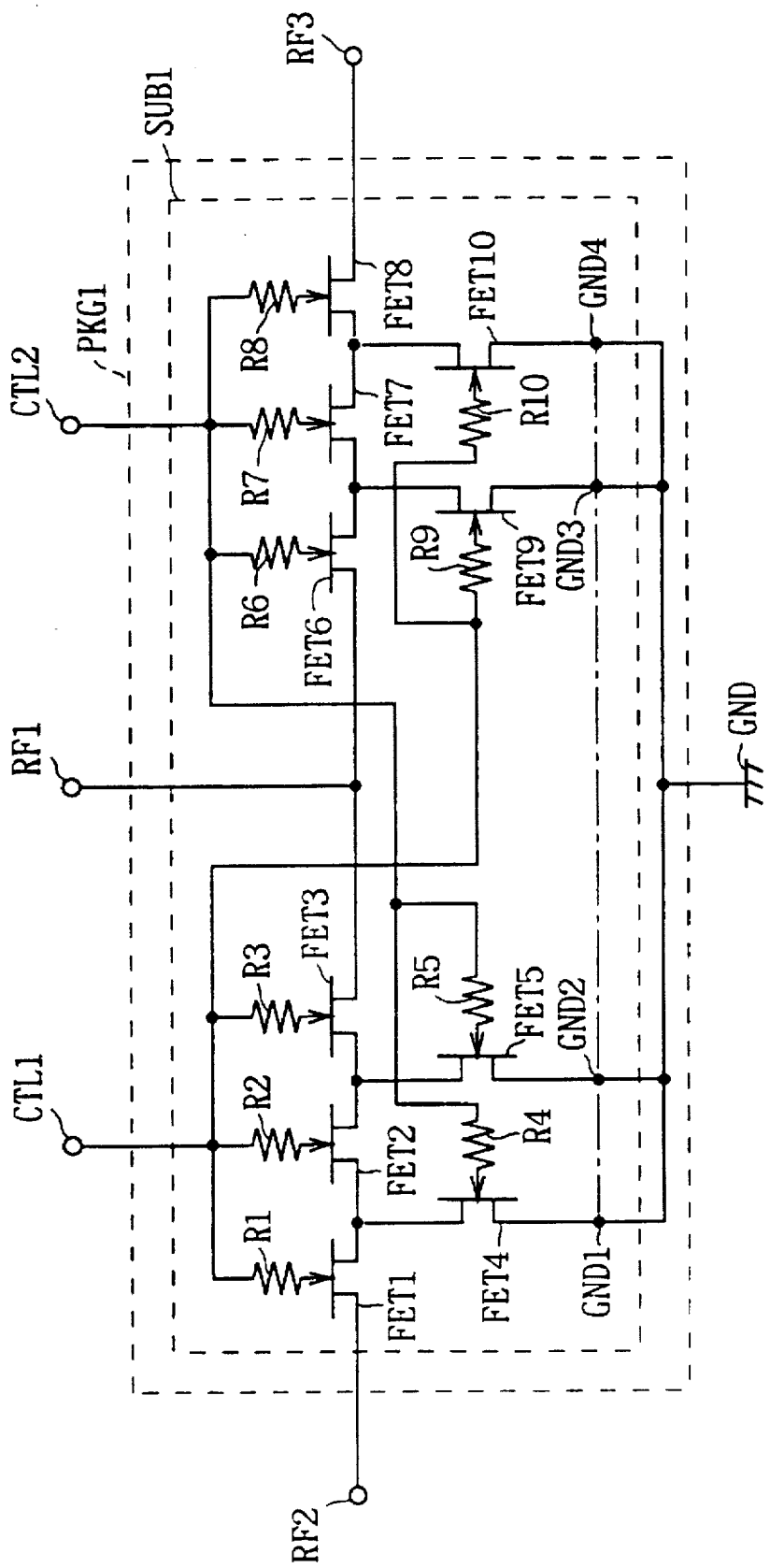
FIG. 2 is a connection diagram illustrating a conventional switch circuit.

In the case where T type construction formed by series FETs and shunt FETs are connected into multistage (two stages, in this case) like the switch circuit 2 of FIG. 2, isolation characteristics can be improved as well. In this case, it is assumed that the gate width of series FETs are 900 [μm] and gate width of shunt FETs are 600 [μm], in order to bring the insertion loss to the same level as that of the cases of the switch circuit 1 of FIG. 1 and the switch circuit 14 of FIG. 8.

Figure 4:
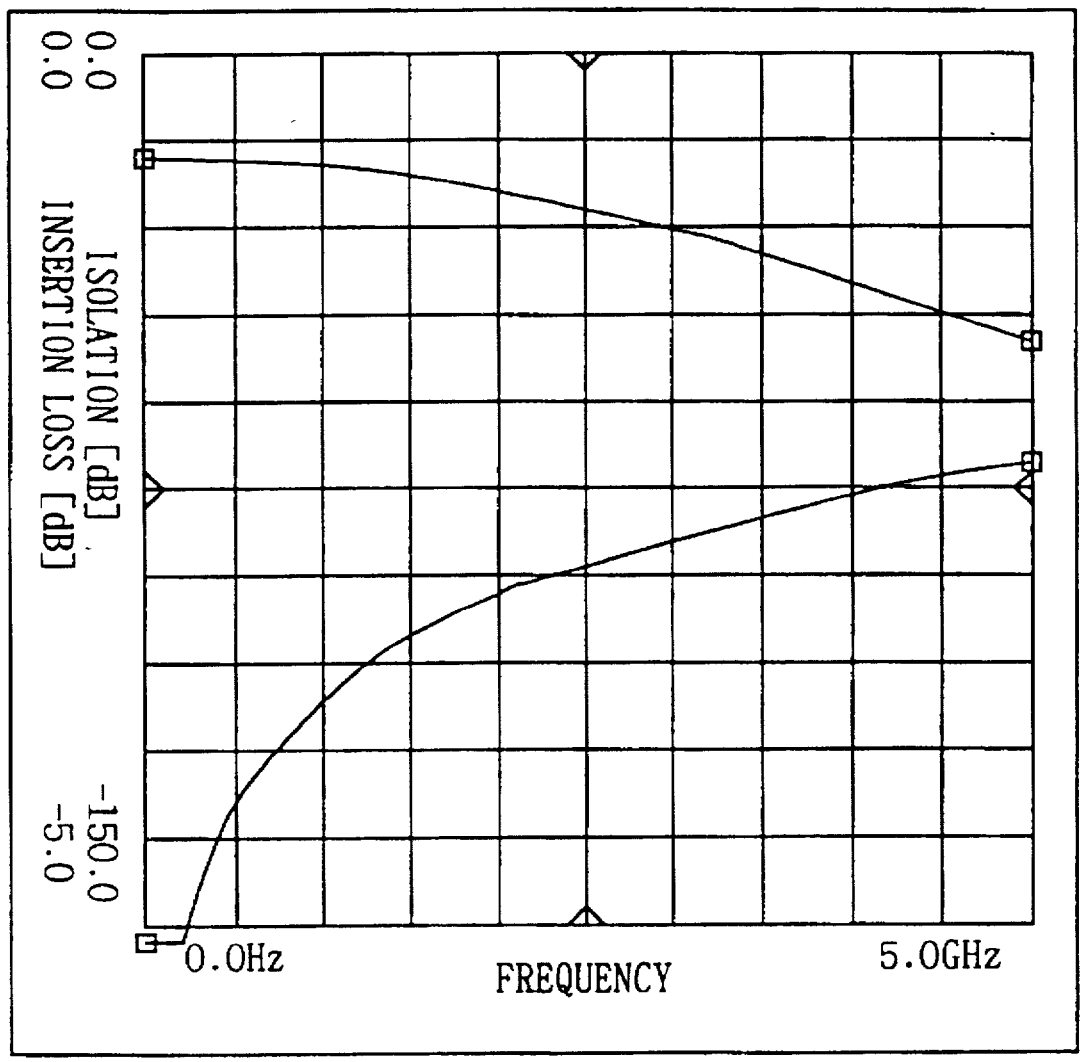
FIG. 4 is a characteristic curvilinear diagram illustrating insertion loss and isolation characteristics of an SPDT switch circuit according to the conventional circuit.

At this time, result of simulation of frequency dependency of the insertion-loss and the isolation of the conventional circuit 2 is shown in FIG. 4.

From FIG. 4, it is known that the insertion loss of the conventional circuit 2 is about 0.79 [dB] on 2 [GHz], and so the insertion loss is larger than that of the switch circuit 14 of the embodiment and that of the conventional circuit 1.

This is due to the fact that the signal leakage from the series FET of OFF side (in the case where the first signal path RF1-RF2 is turned on, FET6 which is placed on the second signal path RF1-RF3) increases, because the gate width of the series FETs have been increased.

So, it is considered to diminish the gate width of the series FET in order to diminish leakage of the signal from the series FET which is placed on the second signal path RF1-RF3, however, in this case the ON resistance Ron of the ON-state FET (when the first signal path RF1-RF2 is on, FET11, FET2, and FET3) increase, as a result the loss increase. Thus, in the case where the stages of the switch circuit have been increased, increasing of loss can not be avoided.

On the other hand, as to isolation characteristics, that of the switch circuit 2 of FIG. 2 is greatly improved into about 93 [dB]. However, the result of the simulation of insertion loss and isolation which has been obtained until now is for the case where the ground regions of respective circuits are ideal ones.

In general, on a portable terminal, plastic mold package which is low priced and able to be minimized is used as an IC package in many cases, because miniaturization and cost reduction of a switch IC are indispensably required.

In this case, the ground region of the semiconductor substrate and the ground terminal of the IC package are connected by means of a bonding Wire of small diameter, and so inductance component of this wire cannot be ignored, on quasi-microwave band.

In general, on a small-sized plastic molded package, inductance of about 1-2 [nH] is usually given. Moreover, the terminal itself of the package has a certain measure of inductance (for instance, 0.5 [nH]).

Then, in the switch circuits of FIG. 1, FIG. 2, and FIG. 8, under the condition that the grounds (the grounds GND1 and GND2 in the cases of the switch circuits 14 and 1 of FIGS. 1 and 8, the grounds GND1 to GND4 in the case of the switch circuit 2 of FIG. 2) on the semiconductor substrate are common and the grounds are respectively connected to the grounding terminal of the package via an inductor, isolation characteristics are simulated and shown in FIG. 10. Provided that the grounds of the packages are ideal ones, and the inductance between the semiconductor substrates and the packages are respectively 0.1 [nH], 0.25 [nH], and 0.5 [nH].

According to this, it is known that the isolation of the switch circuit 2 of which stages have been increased in number as shown in FIG. 2 is greatly degraded, and the switch circuit 14 of the embodiment shown in FIG. 8 is the best.

This is owing to the fact that the signal leaks via the ground region which is not ideal and the shunt FET, in the case of the switch circuit 2. It is owing to the fact that, for instance, when the first signal path RF1-RF2 is OFF, a signal which has leaked from FET5, FET9, and FET10 to the ground region which is not ideal leaks to the signal terminal RF1 via FET4 and FET1 in turn.

In this connection, such a phenomenon occurs in the case of the switch circuit 1 of FIG. 1 as well, however, gate width of FET1 of the case of the switch circuit 2 of FIG. 2 is larger, and so degradation of inductance which is due to parasitic inductance become large.

The abovementioned can be said in the case where the number of stages of switch has been further increased, and small inductance of about 0.1 [nH] cannot be avoided.

Increasing of number of the stages means increasing of size of the semiconductor substrate. Therefore, when it is considered to suppress insertion loss to a certain degree smaller value, on an assumption that miniaturization and a low priced package are required, it is known that the switch circuit 14 shown in FIG. 8 is the best for a use in such as a portable terminal which needs great isolation on quasi-microwave band.

Moreover, isolation characteristics of the case where the ground regions on the semiconductor substrate have been made independent from each shunt FET are shown in FIG. 10.

In the case where parasitic inductance L of the ground is, for instance, 0.5 [nH], isolation characteristics are improved in comparison with the case where the grounds are common, with respect to any of the switch circuits of FIG. 1, FIG. 2, and FIG. 8. This is due to the fact that degrading of isolation which is caused by signal leakage via the ground is eliminated.

However, the isolation has been aggravated in proportion as impedance (which is due to parasitic inductance L) of the shunt FET has increased in comparison with the case where the ground is ideal.

In this connection, to suppress parasitic inductance L to a same extent, it is required to increase the number of the wire for connecting the semiconductor substrate and the package by twice in the cases of FIG. 1 and FIG. 8, and to increase by four times in the case of FIG. 2. By isolating the ground regions which are placed on the semiconductor substrate, in this manner, it is able to greatly improve the isolation.

However, from FIG. 10 it is known that in the case of multistage-type switch circuit 2 of FIG. 2 of which grounds are common, isolation is greatly aggravated with a little inductance of about 0.1 [nH]; moreover, in a real plastic mold packaged IC, there is inductance in a ground terminal (lead) as well, and also it is not able to make parasitic inductance zero, in time of mounting.

Accordingly, even if the grounds which have been placed on the semiconductor substrate have been isolated, it is difficult to make isolation approach ideal state of the grand. From this, it is known that the switch circuit 14 which has been shown in the embodiment is the best, in even the case where the grounds on the substrate have been made independent.

As stated above, by biasing, with respect to direct current, the drain region and the source region of each FET in the switch circuit into the same electric potential as GND1 or GND2 via the resistors R7, R8, R9, R10, and R11, it is able to realize a low-priced and small-sized switch circuit which shows satisfactory isolation characteristics.

Moreover, in the case of the switch circuit 14, capacitors C4, C5 and C6 are connected to the signal terminals RF1 to RF3 of the IC. Hereby, the signal terminals RF1 to RF3 and the ground terminal GND are isolated from external circuits with respect to direct current. Moreover, DC bias Vdd2 is applied to the semiconductor grounds GND1 and GND2 via a high-impedance element Z1 (in general, a resistor or an inductor), and applied to the drain and source regions of each FET via R7, R8, R9, R10, and R11, in addition.

At this time, if the DC bias Vdd2 has been set to an appropriate value, it is able to make the OFF-bias of the gate of each FET negative, on even the case where the control terminals CTL1 and CTL2 are controlled with only positive voltages. For instance, in the case where the DC bias Vdd2 has been set to 2 [V] and controlling has been performed with the control voltages CTL1 and CTL2 of 0/3 [V], electric potentials of the gates toward the drains and the sources of respective FETs become relatively 1/−2.

Generally speaking, because pinch-off voltage of a GaAs FET is negative or about 0 [V], it is required to apply a negative bias to the gate, to make the FET pinch-off state, that is, OFF state. However, in the case of the switch circuit 14, it is able to render the electric potential of the gate toward the drain and the electric potential of the gate toward the source negative respectively, and to render the FET pinch-off state (OFF) hereby, and to let the FET perform switching operation.

Moreover, because biasing of each drain and source is performed via the substrate ground, a signal which has leaked from the drain or source in the signal path is directly drawn into the substrate ground, therefore, aggravation of isolation hardly occurs via this bias path.

As stated above, according to the switch circuit 14 shown in FIG. 8, it is able to realize a small-sized and low-priced IC which can operate with a positive power source and which shows high isolation.

(2—2) SPDT Switch Circuit in which DC Stopping Capacitor is added to Shunt FET

Figure 11:
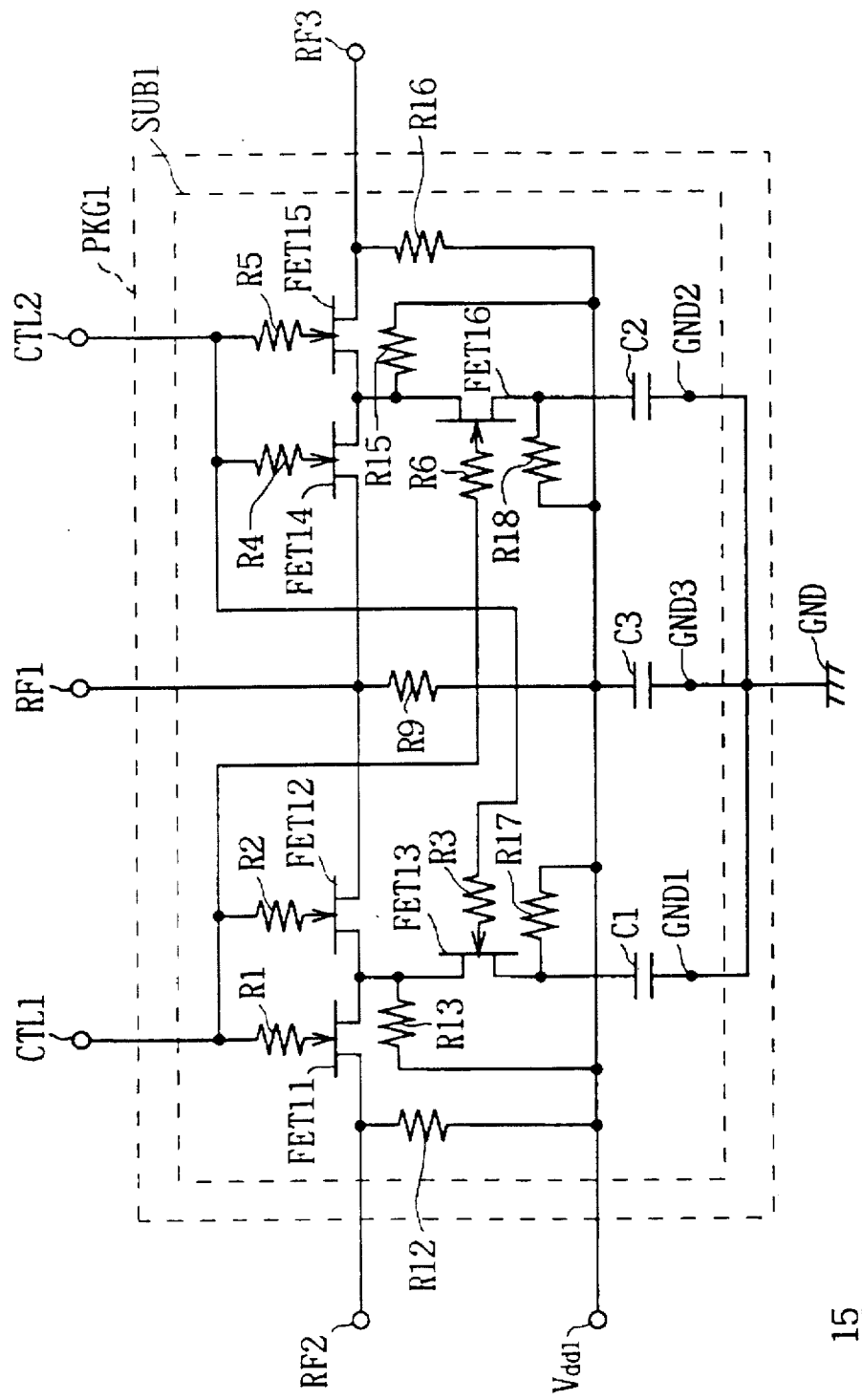
FIG. 11 is a connection diagram illustrating an example of a semiconductor integrated circuit which includes a SPDT switch circuit according to the present invention.

In FIG. 11 which has the same reference numbers as FIG. 8 on the corresponding parts, an example of a switch circuit in which capacitors C1 and C2 have been provided between the shunt FET and the ground region in the semiconductor substrate. The switch circuit 15 has such a construction that the drain region and the source region of the FET which lies in the IC have been respectively isolated from the ground regions by means of the capacitors C1 and C2. Therefore, the drain region and the source region of each FET can be biased into positive by the voltage Vdd1 via the biasing resistors R12 to R18, accordingly, it is able to operate with positive power source alone, as stated above.

Moreover, it is not required to disconnect the grounds with respect to direct current at the exterior of the IC, therefore it is able to save mounting area for DC stopping capacitors and to prevent aggravation of characteristics which is due to mounting. Generally speaking, in the case where grounds are disconnected by means of capacitors, unnecessary parasitic capacitance increase and so the isolation is degraded hereby; however, in the case of the switch circuit 15, high isolation can be obtained, owing to the fact that the first and the second signal paths are formed by a T-type SPST switch circuit respectively, and that the grounds GND1 and GND2 on the substrate have been disconnected, like the abovestated switch circuit 14.

In the case of the switch circuit 15, the capacitor C3 is provided between the Vdd1 terminal and the ground region in the semiconductor substrate, a signal which has leaked via the biasing resistors R12 to R18 can be drawn into the ground region, therefore, aggravation of isolation hardly occurs via these resistors.

As stated above, according to the present invention, it is able to realize a small-sized and low-priced switch circuit which can reconcile high isolation and positive power source operation.

(3) SPDT Circuit in which DC Bias Wire is Shielded by Grounding Metal

In the abovementioned example of a switch circuit, it has been assumed that isolation among respective elements and wires are perfect; however, in practice, these elements and wires are coupled mainly in an electrostatic manner, and degradation of isolation occur.

Figure 12:
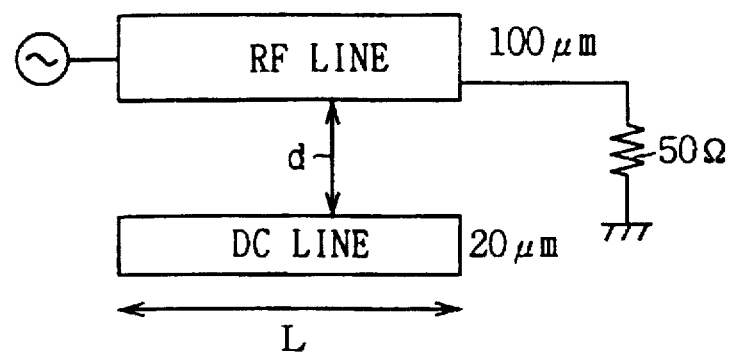
FIG. 12 is a schematic diagram illustrating the layout of a DC line and a RF line.

This will be explained, utilizing FIG. 12. Hereupon, it is assumed that a signal (RF) line has a width of 100 [μm], and the line is placed by the side of a DC line of 20 [μm] wide, in parallel, at a distance of a space d, over a length L. At this time, on the assumption that the GaAs substrate is 200 [μm] thick, the isolation characteristics between the RF line and the DC line becomes like FIG. 13.

If the actual switch circuit is that of T type, and parasitic inductance L is regarded, then it is deemed, from FIG. 10, that isolation of about 50 [dB] (2 [GHz]) become a problem.

Considering integration of the IC circuit, it is required that the space between the signal line and the DC line is limited within 100 [μm].

Figure 13:
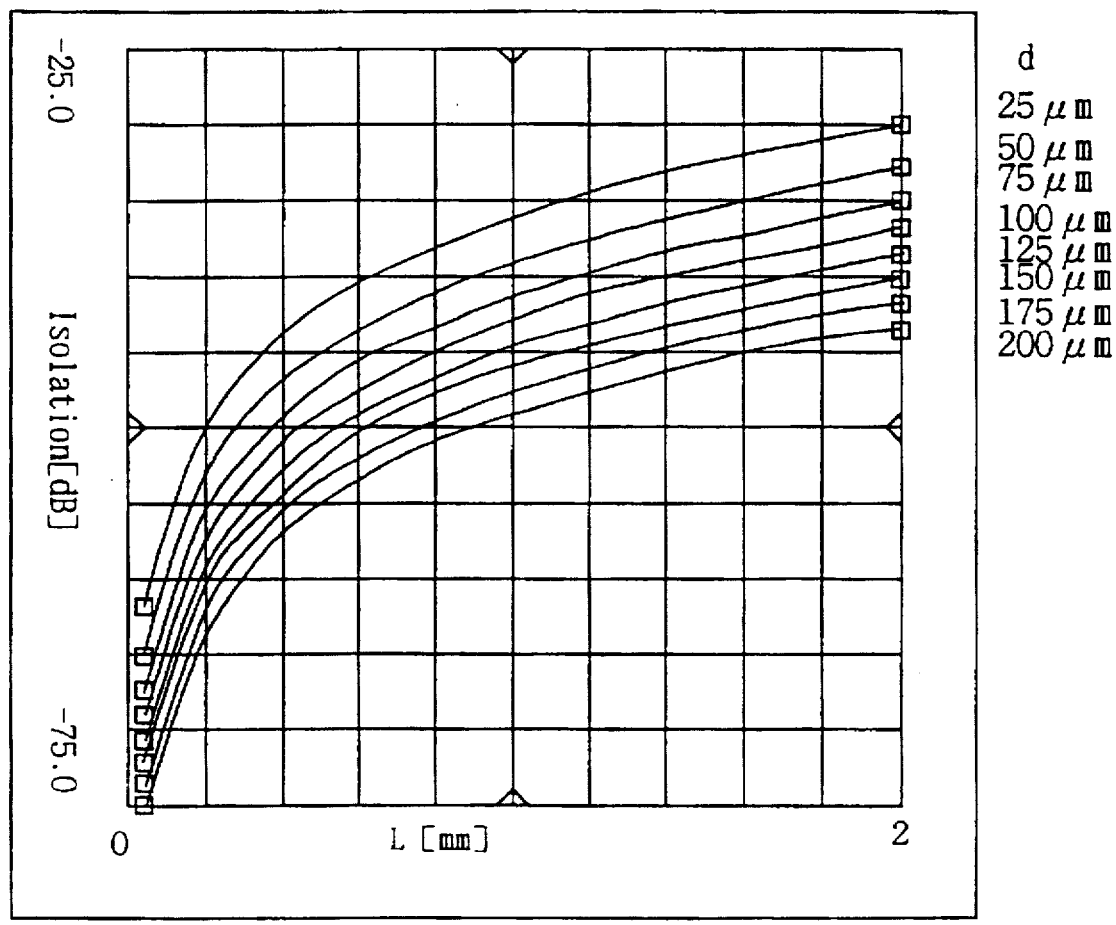
FIG. 13 is a characteristic curve illustrating isolation characteristics of the DC line and the RF line.

Looking at FIG. 13, in the case where the space d is 100 [μm], it is known that isolation of 50 [dB] or more can be maintained when the length L is within about 500 [μm].

Conversely speaking, when the space d is within 100 [μm] and the length L is 500 [μm] or more, the isolation between the RF line and the DC line effect on the isolation of the entire switch circuit.

Figure 14:
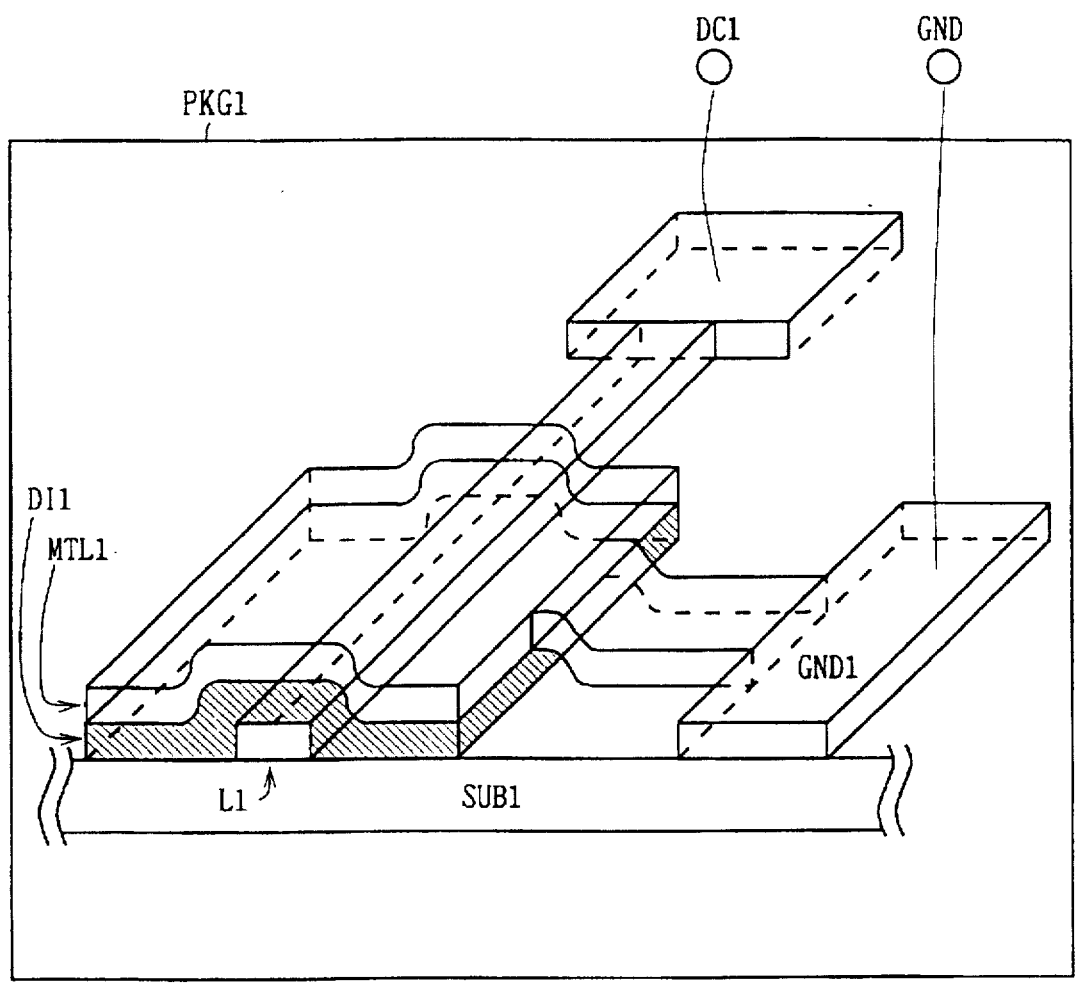
FIG. 14 is a schematic perspective view used to explain the structure for shielding the DC line with the grounded metal film.

Therefore, in the case where the space d between the RF line and the DC line is within 100 [μm], the structure of FIG. 14 is adopted in such a way that the length L become within 500 [μm].

The structure of FIG. 14 is such that a metal film MTL1 which has been connected to the ground region GND1 is arranged on the upside of the DC line L1 via an interlayer insulating film DI1. The DC line L1 is thus shielded by the 2nd metal which has been connected to the ground region, therefore, it is able to eliminate coupling with the other elements or lines, and to eliminate degradation of the isolation. That is, by adopting this structure, it is able to diminish the distance between the DC line L1 and the other elements and lines, and so it is enabled to diminish the area of the substrate. Moreover, it is able to accomplish a function of bypassing capacitance such as the capacitance C3 of FIG. 11, at a same time. In particular, if 30 [%] or more of the DC line L1 which lies in the vicinity of the signal line is covered with the structure of FIG. 14, a large effect is obtained.

As stated above, by applying the structure of FIG. 14 to the abovementioned respective switch circuits, miniaturization of a semiconductor substrate, that is, miniaturization of a switching IC and lowering of a price are enabled, along with maintaining of high isolation.

(4) Other Embodiments

In the abovementioned embodiment, the stopping capacitance C1, C2, or C3 are utilized to isolate the FET from the ground GND with respect to direct current; impedance of these capacitance with respect to the treated frequency may be set to 30 [%] or less of impedance of the bias resistors which are used in each switch circuit.

In the abovementioned embodiments, single-gate FETs are used as the FETs, however, the present invention is not only limited to the construction herein disclosed but multi-gate FETs may be utilized.

Moreover, in the abovementioned embodiments, GaAs FETs are used, but may be formed by the other semiconductor materials.

The abovementioned FET can be widely applied to junction-type FETs and to FETs which have the other structure.

Moreover, in the abovementioned embodiments, a plastic package is used as the package of the semiconductor substrate on which the switch circuit is formed; however the present invention is not only limited to such case, but may be formed by the other package.

As described above, according to the present invention, a switch circuit which has low insertion loss and high isolation can be constructed by combination of only three FETs, therefore miniaturization can be reconciled with it.

While there has been described in connection with the preferred embodiments of the invention, it will be obvious to those skilled in the art that various changes and modifications may be aimed, therefore, to cover in the appended claims all such changes and modifications as fall within the true spirit and scope of the invention.

What is claimed is:

1. A semiconductor integrated circuit device comprising:
   a first and a second FETs connected in series with respect to the signal path;
   a third FET connected between the node of said first and second FETs and a ground region;
   a first high-impedance element connected between the gate terminal of said first FET and a first control terminal for controlling said first FET and said second FET; and
   a second high-impedance element connected between the gate terminal of said second FET and said first control terminal.

2. The semiconductor integrated circuit device according to claim 1, wherein
   a part or the entire of a portion, paralleled to an RF signal line at a short distance, out of a biasing DC signal line which has been provided on a semiconductor substrate, is masked with a metal pattern of the ground electric potential which has been provided in such a way that a insulating layer is inserted between them.

3. The semiconductor integrated circuit device according to claim 1, wherein
   the ground region connected to said third FET is provided in such a way as to be disconnected from the other ground regions laid on the semiconductor substrate.

4. The semiconductor integrated circuit device according to claim 1, wherein
   the source terminals and/or the drain terminals of said first and second FETs are biased from said ground via resistors.

5. The semiconductor integrated circuit device according to claim 1, wherein
   said third FET is connected to said ground region via capacitance.

6. The semiconductor integrated circuit device according to claim 5, wherein
   the source terminals and/or the drain terminals of said first, second, and third FETs are biased via resistors in which one end is connected to the bias line.

7. The semiconductor integrated circuit device according to claim 6, wherein
   capacitance is connected between said bias line and said ground region, and the impedance of the capacitance is nearly 30% of the impedance of said resistor or less.

8. A semiconductor integrated circuit device comprising:
   a first and a second FETs connected in series with respect to a first signal path for relating a first signal terminal and a second signal terminal;
   a third FET connected between the node of said first and second FETs and a first ground region;

a first high-impedance element connected between the gate terminal of said first FET and a first control terminal for controlling said first FET and said second FET;

a second high-impedance element connected between the gate terminal of said second FET and said first control terminal;

a fourth and a fifth FETs connected in series with respect to a second signal path for relating said first signal terminal and a third signal terminal;

a sixth FET connected between the node of said fourth and fifth FETs and a second ground region;

a third high-impedance element connected between the gate terminal of said fourth FET and a second control terminal for controlling said fourth FET and said fifth FET; and a fourth high-impedance element connected between the gate terminal of said fifth FET and said second control terminal.

9. The semiconductor integrated circuit device according to claim 8, wherein a part or the entire of a portion, paralleled to an RF signal line at a short distance, out of a biasing DC signal line which has been provided on a semiconductor substrate, is masked with a metal pattern of the ground electric potential which has been provided in such a way that a insulating layer is inserted between them.

10. The semiconductor integrated circuit device according to claim 8, wherein said first ground region is provided in such a way as to be disconnected from said second ground regions, and also each said first and second ground region is provided in such a way as to be disconnected from the other ground regions laid on the semiconductor substrate.

11. The semiconductor integrated circuit device according to claim 8, wherein:

the source terminals and/or the drain terminals of said first and second FETs are biased from said first ground region via resistors; and the source terminals and/or the drain terminals of said fourth and fifth FETs are biased from said second ground region via resistors.

12. The semiconductor integrated circuit device according to claim 8, wherein:

said third FET is connected to said first ground region via a first capacitance; and said sixth FET is connected to said second ground region via a second capacitance.

13. The semiconductor integrated circuit device according to claim 12, wherein:

the source terminals and/or the drain terminals of said first, second, and third FETs are biased via resistors in which one end is connected to the bias line; and the source terminals and/or the drain terminals of said first, second, and third FETs are biased via resistors in which one end is connected to said bias line.

14. The semiconductor integrated circuit device according to claim 13, wherein capacitance is connected between said bias line and said first and second ground regions, and the impedance of the capacitance is nearly 30% of the impedance of said resistor or less.

* * * * *